United States Patent [19]

Bahlmann

[11] Patent Number: 4,870,533
[45] Date of Patent: Sep. 26, 1989

[54] TRANSISTOR PROTECTION CIRCUIT

[75] Inventor: Johannes P. M. Bahlmann, Eindhoven, Netherlands

[73] Assignee: U.S. Philips Corp., New York, N.Y.

[21] Appl. No.: 102,308

[22] Filed: Sep. 25, 1987

Related U.S. Application Data

[63] Continuation of Ser. No. 636,034, Jul. 30, 1984, abandoned.

[30] Foreign Application Priority Data

Aug. 18, 1983 [NL] Netherlands .......................... 8302902

[51] Int. Cl.$^4$ ............................................ H02H 3/087
[52] U.S. Cl. ....................................... 361/101; 361/98; 323/516; 323/907; 330/207 P; 330/298
[58] Field of Search .......................... 361/93, 98, 101; 330/207 P, 298; 323/315, 316, 907

[56] References Cited

U.S. PATENT DOCUMENTS

| | | | |
|---|---|---|---|
| 3,792,316 | 2/1974 | Bondini et al. ...................... | 361/98 |
| 3,845,405 | 10/1974 | Leidich ................................. | 330/298 |
| 3,924,158 | 12/1975 | Fransworth ........................ | 361/98 X |
| 4,021,701 | 5/1977 | Davies .......................... | 330/207 P X |
| 4,321,648 | 3/1982 | Kaplan ......................... | 330/207 P X |
| 4,330,757 | 5/1982 | Fukaya et al. .................. | 320/267 X |

Primary Examiner—Derek S. Jennings
Attorney, Agent, or Firm—Bernard Franzblau

[57] ABSTRACT

An output transistor ($T_1$) is to be protected from damage due to excessive currents. This transistor supplies a current ($I_o$) to a load (3) and is driven by a driver transistor ($T_2$). The base-emitter junction of a current-sensing transistor ($T_3$) is connected in parallel with that of the output transistor ($T_1$). The collector current of transistor ($T_3$) is a measure of the current ($I_o$) of the output transistor ($T_1$). A current generator (5) supplying a reference current ($I_{ref}$) is coupled to the collector of the current-sensing transistor ($T_3$). If the collector current of the current-sensing transistor exceeds the reference current ($I_{ref}$) the protection circuit is activated so that the driver transistor is bottomed via an emitter-follower ($T_4$). The base current of transistor $T_1$ is thereby limited. Thus, the output current of the output transistor is limited to a maximum value which is substantially equal to the product of the reference current ($I_{ref}$) and the ratio between the emitter areas of the output transistor ($T_1$) and the current-sensing transistor ($T_3$).

28 Claims, 2 Drawing Sheets

TRANSISTOR PROTECTION CIRCUIT

This is a continuation of application Ser. No. 636,034 filed July 30, 1984, now abandoned.

BACKGROUND OF THE INVENTION

This invention relates to a transistor protection circuit comprising:

an output transistor of a first conductivity type comprising a collector, base and emitter, a driver transistor of the first conductivity type comprising a collector, base and emitter, the emitter being coupled to the base of the output transistor, a current-sensing transistor of the first conductivity type comprising a collector, base and emitter, having its base and emitter coupled to the base and the emitter, respectively, of the output transistor, its collector current being a measure of the collector current of the output transistor, and means coupled to the current-sensing transistor for limiting the drive current to the output transistor depending on the collector current of the current-sensing transistor.

Such a circuit may be used, for example, in audio and video circuitry and in motor-control circuits.

Such a circuit is known from inter alia, U.S. Pat. No. 4,330,757. In this circuit the current through the output transistor is measured by means of a current-sensing transistor whose base-emitter junction is arranged in parallel with that of the output transistor, the collector current of the current-sensing transistor being a fraction of the collector current of the output transistor. By means of a current mirror the collector current of the current-sensing transistor is reflected to a resistance element which is arranged in parallel with the base-emitter junction of a clamping transistor, the collector of the clamping transistor being connected to the base of the driver transistor. In the case of an excessive collector current of the current-sensing transistor the clamping transistor is driven into conduction so that, what would otherwise be a part of the base current of the driver transistor is drained via the clamping transistor.

A disadvantage of this known circuit arrangement is that in integrated form it exhibits a high degree of instability in the protection loop. These instabilities are caused by phase shifts in the current mirror arranged in the protection loop, which current mirror comprises PNP-transistors which have a comparatively low cut-off frequency.

SUMMARY OF THE INVENTION

Therefore, it is an object of the invention to provide a transistor protection circuit which has a stable protection loop and which is suitable for manufacture in integrated form. To this end a transistor protection circuit of the type specified in the opening paragraph is characterized in that the current limiting means are provided with:

a current generator for supplying a reference current, the generator output being coupled to the collector of the current-sensing transistor, and a semiconductor P/N junction which is coupled to the output of the current generator, and which is driven to become forward-biased when the collector current of the current-sensing transistor is substantially equal to the reference current from the current generator. The invention utilizes the principle that in the event that the collector current of the current-sensing transistor becomes larger than the reference current from the current generator, the voltage at the output of the current generator changes from a high to a low value, thereby turning on a semiconductor junction by means of which the drive current to the output transistor is limited. The protection loop exhibits no instabilities because the protection loop only comprises transistors of one conductivity-type. Moreover, the arrangement is highly suitable for fabrication as an integrated circuit.

The semiconductor P/N junction may be coupled to the output of the current generator via an emitter-follower transistor of the first conductivity type comprising a collector, base, and emitter, which follower transistor has its base coupled to the output of the current generator and its emitter coupled to the semiconductor junction. In this case the semiconductor junction may comprise the collector-base junction of the driver transistor, the collector of the driver transistor being coupled to the emitter of the follower transistor. When the protection circuit is actuated the driver transistor is bottomed, thereby limiting the base current of the output transistor. As an alternative the semiconductor junction may comprise a diode, or a transistor connected as a diode, having its cathode coupled to the emitter of the follower transistor and its anode coupled to the base of the driver transistor. In the latter case, when the protection circuit becomes operative a part of what would otherwise be the base current of the driver transistor is drained via the diode so that the current through the output transistor is limited. As a modification the cathode may be connected directly to the output of the current generator.

The current generator for supplying the reference current may comprise a constant current source or a reference resistor in series with a reference-voltage source. In order to limit the base current of the output transistor when the output transistor is bottomed a limiting resistor may be arranged in the collector line of the follower transistor.

BRIEF DESCRIPTION OF THE DRAWING

The invention will now be described in more detail, by way of example, with reference to the accompanying drawings, in which.

DESCRIPTION OF THE PREFERRED EMBODIMENTS

Figure 1:
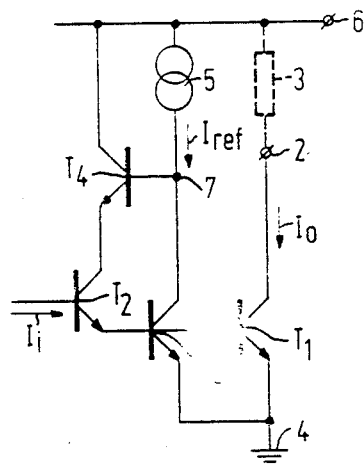
FIG. 1 shows a first embodiment.

FIG. 1 shows a first embodiment of the invention. In this transistor protection circuit transistor $T_1$ is the output transistor to be protected. This transistor can supply a current $I_o$ to a load 3, represented in broken lines, via the collector terminal 2. The emitter of transistor $T_1$ is connected to the negative power-supply terminal 4, which in the present example is connected to ground. The transistor $T_1$ is driven by a driver transistor $T_2$ having an emitter connected to the base of transistor $T_1$. An input current $I_i$ is applied to the base of transistor $T_2$.

In order to prevent the output transistor $T_1$ from being damaged by an excessive current, the output current $I_o$ must be limited to a maximum value. The protection circuit comprises a current-sensing transistor $T_3$ whose base-emitter junction is arranged in parallel with that of transistor $T_1$. The base-emitter area $A_3$ of transistor $T_3$ is smaller than the base-emitter area $A_1$ of transistor $T_1$, so that the collector current of transistor $T_3$ is equal to a fraction $A_3/A_1$ of the collector current of transistor $T_1$. The collector of transistor $T_3$ is coupled to the positive power-supply terminal 6 by means of a current generator 5 which supplies a reference current $I_{ref}$. Furthermore, the collector of transistor $T_3$ is connected to the base 7 of a follower transistor $T_4$ having an emitter connected to the collector of driver transistor $T_2$ and a collector connected to the positive power-supply terminal 6. If the protection circuit is not activated an output current $I_o$ will flow in transistor $T_1$. This current depends on the input current $I_i$ and on the current-gain factors of the transistors $T_2$ and $T_1$. The collector current of transistor $T_3$ is then equal to a fraction of the output current $I_o$. As long as the collector current of $T_3$ is smaller than the reference current $I_{ref}$ from the current generator 5 the transistor $T_3$ presents a load to the current generator 5. As a result of this, the voltage at the base 7 of transistor $T_4$ is comparatively high. The voltage of the emitter of transistor $T_4$ follows the volume on the base 7 with a difference corresponding to one base-emitter junction voltage. As a result, the collector of transistor $T_1$ is at such a voltage that transistor $T_1$ conducts normally. The protection circuit is activated at the instant that the collector current of transistor $T_3$ exceeds the reference current $I_{ref}$. The current generator 5 then presents a load to transistor $T_3$. At this instant the voltage at the base 7 of transistor $T_4$ changes to a comparatively low value. The voltage on the emitter of the transistor $T_4$ and hence on the collector of transistor $T_2$ then becomes so low that the base-collector junction of transistor $T_2$, which is normally cut off, is forward-biased. Transistor $T_2$ is then bottomed so that transistor $T_2$ practically ceases to function as a current amplifier. The emitter current of transistor $T_2$ is then of the same order of magnitude as the input current $I_i$. Since, upon activation of the protection circuit, the collector current of transistor $T_3$ is equal to the reference current $I_{ref}$ and the collector current of transistor $T_1$ is equal to a fraction $A_1/A_3$ of the collector current of transistor $T_3$, the maximum output current will be $$I_{omax} = \frac{A_1}{A_3} \cdot I_{ref}.$$

In the foregoing the base current which transistor $T_4$ draws from the current $I_{ref}$ has been ignored. However, this base current is generally so small that its influence on the maximum output current is minimal. Transistors $T_1$ and $T_4$ have current-gain factors $\beta$ which in practice are of the order of magnitude of 100. For a maximum output current of, for example, $I_{omax} = 500$ mA the maximum collector-emitter current of the transistors $T_2$ and $T_4$ may be approximately 5 mA, so that the base current of transistor $T_4$ will be approximately 1/20 mA. For a ratio $A_1/A_3$ between the emitter areas $\approx 500$ the collector current of transistor $T_3$ will be substantially 1 mA, which is large relative to the base current of transistor $T_4$.

Instead of adjusting the ratio between the collector currents of the transistors $T_1$ and $T_3$ by means of the ratio between their emitter areas, this ratio may be adjusted by arranging a resistor in the emitter line of one of the transistors $T_1$ and $T_3$ or by arranging a resistor in both emitter lines. Upon arranging resistors in the emitter lines the ratio $I_{omax}/I_{ref}$ becomes temperature-dependent unless the ratio between the resistor values is inversely proportional to the ratio between the emitter areas.

Figure 2:
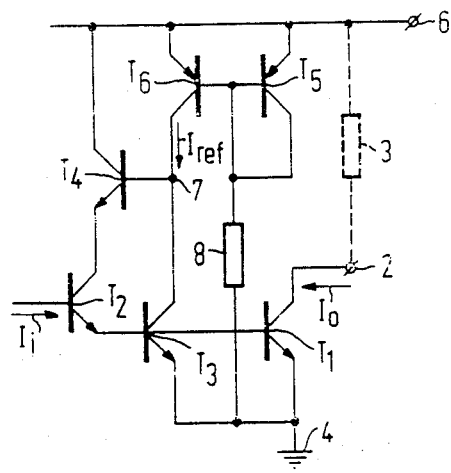
FIG. 2 shows a first variant of the circuit shown in FIG. 1.

FIG. 2 shows a first variant of the circuit shown in FIG. 1, similar components bearing the same reference numerals. The current generator 5 for supplying the reference current $I_{ref}$ comprises a current source. This current source comprises a reference resistor 8 which, in series with a PNP-transistor $T_5$ arranged as a diode, is clamped between the negative and the positive power-supply terminals 4 and 6. If the resistance of the resistor 8 is sufficiently high the current in this branch is almost wholly determined by this resistor. By means of a transistor $T_6$, whose base-emitter path is connected in parallel with that of transistor $T_5$, this current is reflected to the collector of transistor $T_3$. The present embodiment employs PNP-transistors $T_5$ and $T_6$, but these transistors do not affect the stability of the circuit because they do not form part of the feedback loop comprising the transistors $T_3$, $T_4$ and $T_2$.

The circuit operates in the same way as that in FIG. 1. If the collector current of transistor $T_3$ is smaller than the collector current $I_{ref}$ of transistor $T_6$, transistor $T_3$ with its high collector-impedance constitutes a load for the current source transistor $T_6$ and the voltage at point 7 is comparatively high. However, if the collector current of transistor $T_3$ is larger than the collector current $I_{ref}$ of transistor $T_6$, transistor $T_6$ with its high collector impedance presents a load to the transistor $T_3$, which then functions as the current-source transistor. The voltage at point 7 is then comparatively low so that transistor $T_2$ is bottomed.

Figure 3:
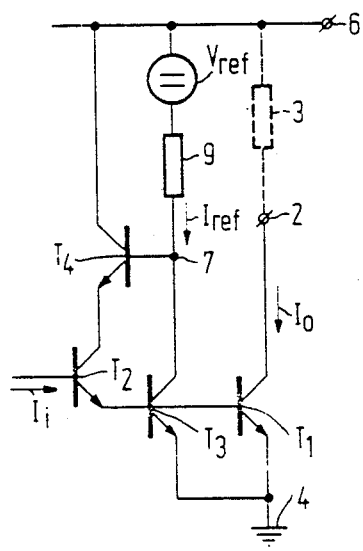
FIG. 3 shows a second variant of the circuit shown in FIG. 1.

A second variant of the circuit shown in FIG. 1 will be described with reference to FIG. 3, in which similar components bear the same reference numerals as in FIG. 1. The current generator in this variant comprises a reference resistor 9, of which one terminal is connected to the collector of transistor $T_3$ and the other terminal is connected to a reference voltage $V_{ref}$. The reference current $I_{ref}$ is substantially equal to the quotient of the reference voltage and the resistance value of the resistor 9 if the reference voltage is not too low and the resistance of said resistor is sufficiently high. The circuit operates in the same way as that shown in FIGS. 1 and 2, the reference resistor forming a load for transistor $T_3$ when the protection circuit is activated so that the voltage on point 7 changes and transistor $T_2$ is bottomed. By an appropriate choice of the reference voltage the operation of the protection circuit, and consequently the maximum output current $I_o$, can be made substantially temperature-independent. More particularly, it can be arranged that a voltage with a positive temperature coefficient appears across the reference resistor, which coefficient is substantially equal to the positive temperature coefficient of the reference resistor, so that the reference current is substantially temperature-independent.

Figure 4:
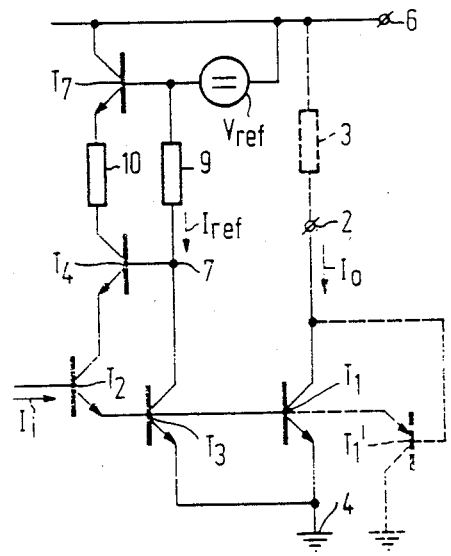
FIG. 4 shows a third variant of the circuit shown in FIG. 1.

A third variant of the circuit shown in FIG. 1 is shown in FIG. 4, in which similar components bear the same reference numerals. The current generator in this variant comprises a reference resistor 9 to which a reference voltage $V_{ref}$ is applied. When the circuit is integrated the NPN-transistor $T_1$ gives rise to a parasitic PNP-transistor $T_1'$, whose collector is connected to the substrate of the integrated circuit, whose base is connected to the collector of transistor $T_1$ and whose emitter is connected to the base of transistor $T_1$. This transistor $T_1'$ is shown in broken lines in the Figure. When transistor $T_1$ is bottomed its collector voltage drops below its base voltage so that the base-emitter junction of the parasitic transistor $T_1'$ is driven into conduction. The drive current of transistor $T_1$, which is supplied by transistor $T_2$, may than become fairly large, which demands an unnecessary amount of power. In order to limit this drive current a limiting resistor 10 is arranged in the collector line of transistor $T_4$, which limiting resistor is coupled to the positive power-supply terminal 6 via a transistor $T_7$ whose base is at the reference voltage $V_{ref}$. It is to be noted that as an alternative the limiting resistor may be connected directly to the positive power-supply terminal 6.

Figure 5:
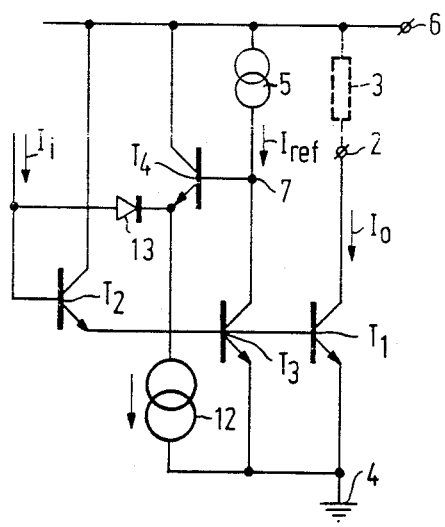
FIG. 5 shows another embodiment.

Another protection circuit in accordance with the invention will be described with reference to FIG. 5 in which idential parts bear the same reference numerals as in FIG. 1. The emitter of transistor $T_4$ is no longer connected to the collector of transistor $T_2$, but $T_4$ is still arranged as an emitter-follower, the current source 12 being arranged in its emitter line. The cathode of a diode 13 is connected to the emitter of transistor $T_4$, the anode of said diode being connected to the base of transistor $T_2$. Instead of a diode it is possible to employ a transistor with a short-circuited base-collector junction. If the collector current of the transistor $T_3$ is smaller than the current $I_{ref}$ from the current generator 5, the voltage on the base 7 and hence on the emitter of transistor $T_4$ is comparatively high, namely higher than the voltage on the base of driver transistor $T_2$. Diode 13 is then cut off. If the collector current of transistor $T_3$ exceeds the current $I_{ref}$ the protection circuit is activated so that the voltage on the base 7 of transistor $T_4$ decreases substantially. The voltage on the emitter of transistor $T_4$ then becomes lower than the voltage on the base of the driver transistor $T_2$ so that diode 13 is turned on. As a result of this a part of the current $I_i$ which would otherwise be fed to the base of the driver transistor is drained via the diode 13. Thus, the output current of transistor $T_1$ is limited to a maximum value $I_{omax} = I_{ref} \cdot A_1/A_3$.

Figure 6:
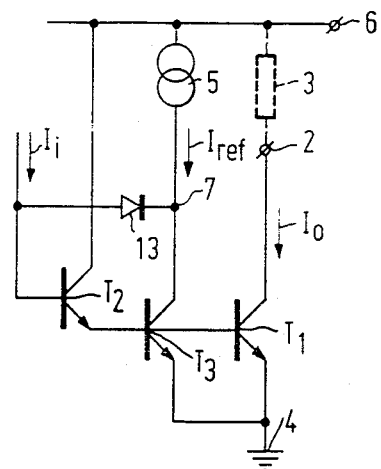
FIG. 6 shows another embodiment.

Another transistor protection circuit in accordance with the invention will be described with reference to FIG. 6, in which idential parts bear the same reference numerals as in FIG. 5. The cathode of the diode 13 is now connected directly to the output 7 of the current generator 5 instead of via a follower transistor. The circuit operates in the same way as that shown in FIG. 5. When the protection circuit is activated a part of what would otherwise be the base current of transistor $T_2$ flows through the collector of transistor $T_3$ via diode 13. This current is small relative to the reference current $I_{ref}$ so that its influence on the maximum value of the output current of transistor $T_1$ may be ignored.

The invention is not limited to the embodiments described but many variations are possible within the scope of the invention as defined by the claims. For example, it is possible to replace the simple emitter-follower transistor by a Darlington transistor or to arrange a diode in series with the base-emitter junction of the follower transistor. Moreover, the current generator may be constructed in various ways.

What is claimed is:

1. A transistor protection circuit comprising:
   an output transistor of a first conductivity type comprising a collector, base and emitter,
   a driver transistor of the first conductivity type comprising a collector, base and emitter, means coupling the emitter of the driver transistor to the base of the output transistor,
   a current-sensing transistor of the first conductivity type comprising a collector, base and emitter, having its base and emitter coupled to the base and emitter, respectively, of the output transistor, its collector current being a measure of the collector current of the output transistor, and
   means coupled to the current-sensing transistor for limiting the drive current to the output transistor depending on the collector current of the current-sensing transistor, characterized in that the current limiting means comprise:
   a current generator for supplying a reference current, the generator output being coupled to the collector of the current-sensing transistor; and
   a semiconductor P/N junction coupled to the output of the current generator and, said P/N junction being driven to become forward-biased when the collector current of the current-sensing transistor is substantially equal to the reference current supplied by the current generator.

2. A transistor protection circuit as claimed in claim 1, wherein the semiconductor junction is coupled to the output of the current generator via an emitter-follower transistor of the first conductivity type comprising a collector, base and emitter, said follower transistor having its base coupled to the output of the current generator and its emitter coupled to the semiconductor junction.

3. A transistor protection circuit as claimed in claim 2, wherein the semiconductor junction comprises the base-collector junction of the driver transistor with the collector of the driver transistor coupled to the emitter of the follower transistor.

4. A transistor protection circuit as claimed in claim 2, wherein the semiconductor junction comprises a diode having a cathode coupled to the emitter of the follower transistor and an anode coupled to the base of the driver transistor.

5. A transistor protection circuit as claimed in claim 1, wherein the semiconductor junction comprises a diode having a cathode coupled to the output of the current generator and an anode coupled to the base of the driver transistor.

6. A transistor protection circuit as claimed in claim 4, wherein the diode comprises a transistor connected as a diode.

7. A transistor protection circuit as claimed in claim 1 wherein the current generator comprises a constant current-source.

8. A transistor protection circuit as claimed in claim 1 wherein the current generator comprises a reference resistor having one terminal connected to the collector of the current-sensing transistor and the other terminal connected to a reference voltage.

9. A transistor protection circuit as claimed in claim 1 wherein a limiting resistor for limiting the collector current of the driver transistor is connected in the collector line of said driver transistor.

10. A transistor protection circuit as claimed in claim 9, wherein the collector-emitter path of a transistor is connected in series with the limiting resistor, and means coupling a base electrode of said transistor to a source of reference voltage.

11. A transistor protection circuit as claimed in claim 1 wherein all of the transistors of the circuit are of the same conductivity type.

12. A transistor protection circuit as claimed in claim 1 wherein said semiconductor junction provides a conduction path when the semiconductor junction becomes forward biased that shunts at least a portion of the signal input current away from the base-emitter path of the driver transistor.

13. A transistor amplifier circuit as claimed in claim 1 wherein the semiconductor junction is distinct from the current sensing transistor and is reverse biased at values of collector current of the current sensing transistor below the value of said reference current supplied by the current generator.

14. A transistor amplifier circuit as claimed in claim 1 wherein the semiconductor junction couples the output of the current generator to the base of the driver transistor.

15. A transistor amplifier circuit with over-current protection comprising:
   an output transistor having an output electrode for coupling to a load,
   a driver transistor having an emitter coupled to a base of the output transistor,
   a current sensing transistor having base and emitter electrodes coupled to base and emitter electrodes, respectively, of the output transistor, such that the collector current of the current sensing transistor is maintained in a given ratio to the collector current of the output transistor,
   said output, driver and current sensing transistors all being of the same conductivity type, and
   means coupled to the current sensing transistor for limiting the output transistor drive current if the collector current of the current sensing transistor exceeds a reference current,
   said current limiting means comprising:
   a current generator having an output which supplies said reference current to the collector of the current sensing transistor, and
   a semiconductor P/N junction coupled to the output of the current generator and reverse-biased during normal operation of the transistor amplifier and forward-biased when the collector current of the current sensing transistor becomes substantially equal to the reference current supplied by the current generator.

16. An amplifier circuit as claimed in claim 15 further comprising:
   means for coupling the collector of the driver transistor to the output of the current generator, so that said semiconductor junction comprises the base-collector junction of the driver transistor.

17. An amplifier circuit as claimed in claim 16 wherein the current generator comprises a current mirror circuit including a transistor of opposite conductivity type to that of the output transistor.

18. An amplifier circuit as claimed in claim 15 further comprising an emitter-follower transistor of said same conductivity type having a base electrode coupled to the output of the current generator and an emitter DC coupled to the semiconductor junction.

19. An amplifier circuit as claimed in claim 15 further comprising:
   an emitter-following transistor of said same conductivity type having a base electrode coupled to the output of the current generator, and
   the semiconductor junction comprises a diode coupled between the emitter of the emitter-follower transistor and the base of the driver transistor.

20. An amplifier circuit as claimed in claim 15 wherein the semiconductor junction comprises a diode coupled between the output of the current generator and the base of the driver transistor and polarized to conduct current towards the output of the current generator.

21. An amplifier circuit as claimed in claim 16 wherein the current generator comprises a source of constant current.

22. Am amplifier circuit as claimed in claim 18 wherein the current generator comprises a source of constant current.

23. An amplifier circuit as claimed in claim 15 wherein the emitter electrodes of the current sensing transistor and the output transistor are coupled together via a substantially resistance-free current path and said semiconductor junction couples said current generator output to a base of the driver transistor, where said base of the driver transistor serves as input of the transistor amplifier circuit.

24. A transistor protection circuit comprising:
   an output transistor of a first conductivity type comprising a collector, base and emitter,
   a driver transistor of the first conductivity type comprising a collector, base and emitter with the emitter coupled to the base of the output transistor,
   a current-sensing transistor of the first conductivity type comprising a collector, base and emitter, its collector current being a measure of the collector current of the output transistor,
   a current generator for supplying a reference current and having an output coupled to the collector of the current-sensing transistor and,
   means coupled to the current-sensing transistor for limiting the drive current to the output transistor when the collector current of the current-sensing transistor exceeds the reference current of the current generator, characterized in that the current-sensing transistor has its base and emitter coupled to the base and the emitter, respectively, of the output transistor and the limiting means comprise an emitter-follower transistor of the first conductivity type comprising a collector, base and emitter, said emitter-follower transistor having its base coupled to the output of the current generator and its emitter coupled to the collector of the driver transistor, and wherein the collector-base junction of the driver transistor becomes forward biassed when the collector current of the current-sensing transistor exceeds the reference current of the current generator.

25. A transistor protection circuit as claimed in claim 24, wherein the current generator comprises a constant current-source.

26. A transistor protection circuit as claimed in claim 24, wherein the current generator comprises a reference resistor having one terminal connected to the collector of the current-sensing transistor and another terminal at a reference voltage.

27. A transistor protection circuit as claimed in claim 24, further comprising a limiting resistor connected in the collector line of said driver transistor for limiting the collector current thereof.

28. A transistor protection circuit as claimed in claim 27, further comprising means connecting the collector-emitter path of a transistor, whose base is at a reference voltage, in series with the limiting resistor.

* * * * *